(12) United States Patent
Schloesser

(10) Patent No.: US 7,772,631 B2
(45) Date of Patent: Aug. 10, 2010

(54) METHOD FOR FABRICATING A MEMORY CELL ARRANGEMENT WITH A FOLDED BIT LINE ARRANGEMENT AND CORRESPONDING MEMORY CELL ARRANGEMENT WITH A FOLDED BIT LINE ARRANGEMENT

(75) Inventor: Till Schloesser, Dresden (DE)

(73) Assignee: Qimonda AG, Munich (DE)

( * ) Notice: Subject to any disclaimer, the term of this patent is extended or adjusted under 35 U.S.C. 154(b) by 540 days.

(21) Appl. No.: 11/493,082

(22) Filed: Jul. 26, 2006

(65) Prior Publication Data
US 2007/0023784 A1 Feb. 1, 2007

(30) Foreign Application Priority Data
Jul. 29, 2005 (DE) ........................ 10 2005 035 641

(51) Int. Cl.
*H01L 27/108* (2006.01)
(52) U.S. Cl. ...................... 257/296; 438/239
(58) Field of Classification Search ............... 257/296; 438/239
See application file for complete search history.

(56) References Cited
U.S. PATENT DOCUMENTS
6,063,669 A 5/2000 Takaishi

| 6,172,390 | B1* | 1/2001 | Rupp et al. | 257/302 |
|---|---|---|---|---|
| 6,396,096 | B1 | 5/2002 | Park et al. | |
| 2002/0117711 | A1* | 8/2002 | Yoneda | 257/330 |
| 2004/0217407 | A1* | 11/2004 | Cho et al. | 257/306 |

FOREIGN PATENT DOCUMENTS
DE 19928781 6/1999
DE 1 003 219 9/1999

OTHER PUBLICATIONS
German Office Action dated Mar. 8, 2006.
* cited by examiner

*Primary Examiner*—Lex Malsawma
*Assistant Examiner*—Tanika Warrior
(74) *Attorney, Agent, or Firm*—Eschweiler & Associates, LLC

(57) ABSTRACT

An integrated circuit includes a memory cell arrangement with a plurality of active regions along a first direction, a plurality of parallel buried word lines (BWL) along a second direction, a plurality of parallel bitlines along a third direction, and a plurality of storage capacitors. The BWLs run through the active regions. Two of the BWLs are spaced apart from one another and from isolation trenches running through a respective active region, the BWLs being insulated from a channel region by a gate dielectric. The bit lines run perpendicular to the second direction, wherein each bit line makes contact with the relevant source region of the associated active region. The first direction lies between the second and third directions. Storage capacitors are connected to associated drain regions in a respective active region.

9 Claims, 17 Drawing Sheets

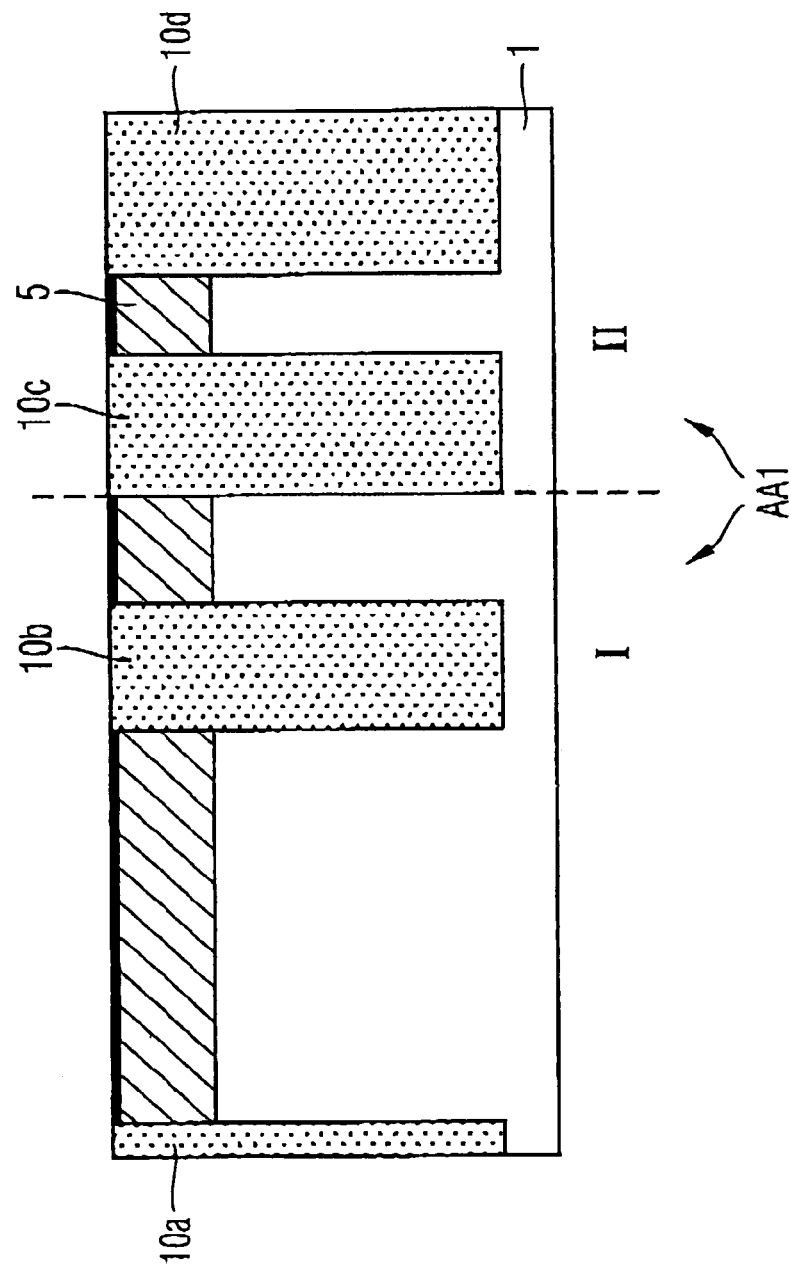

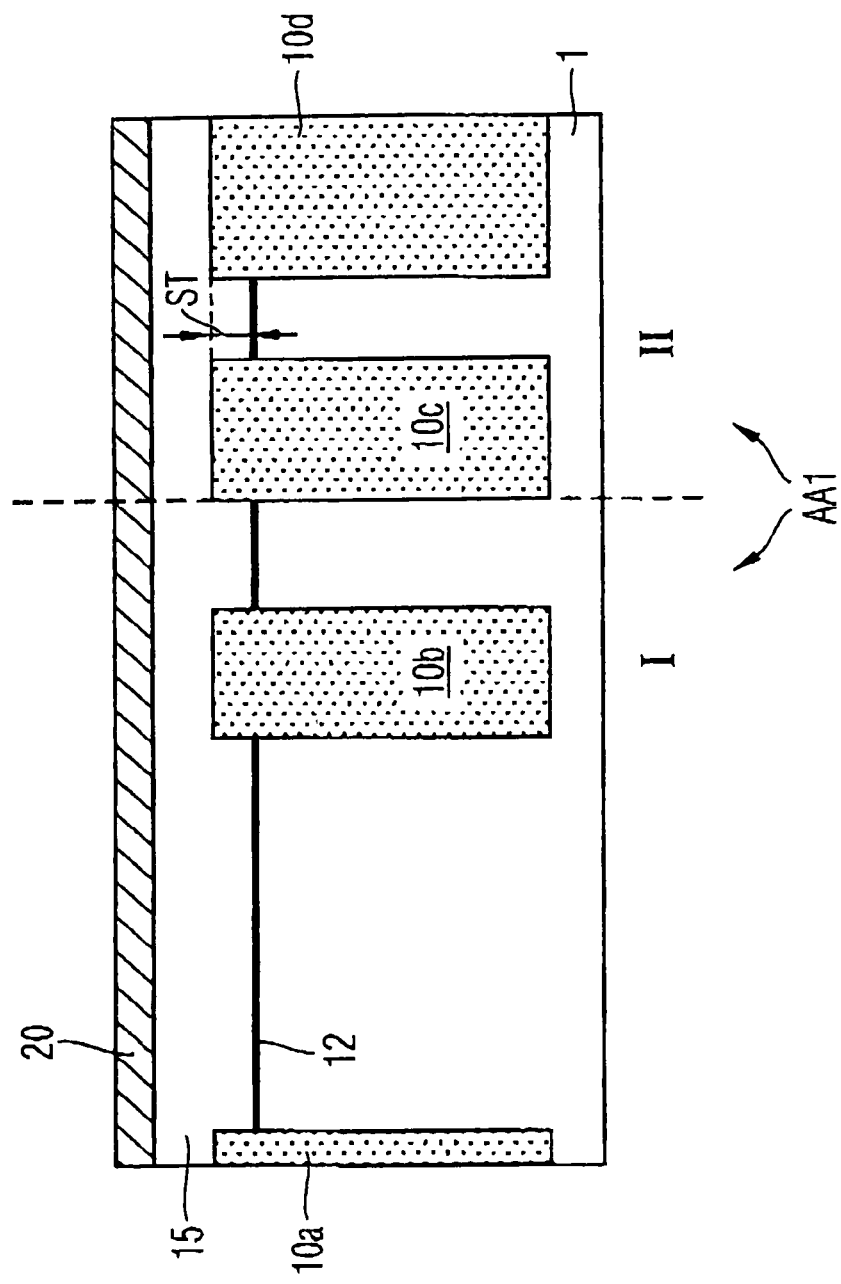

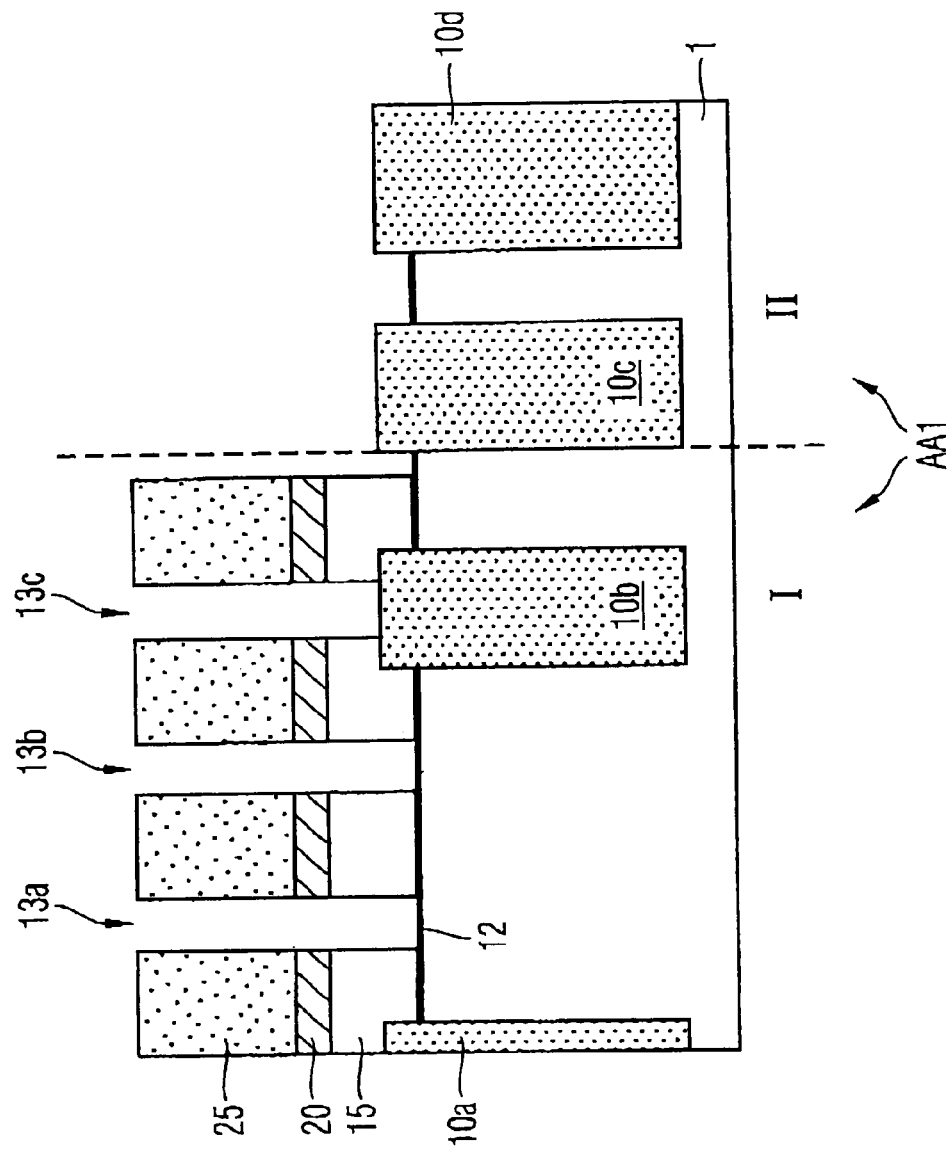

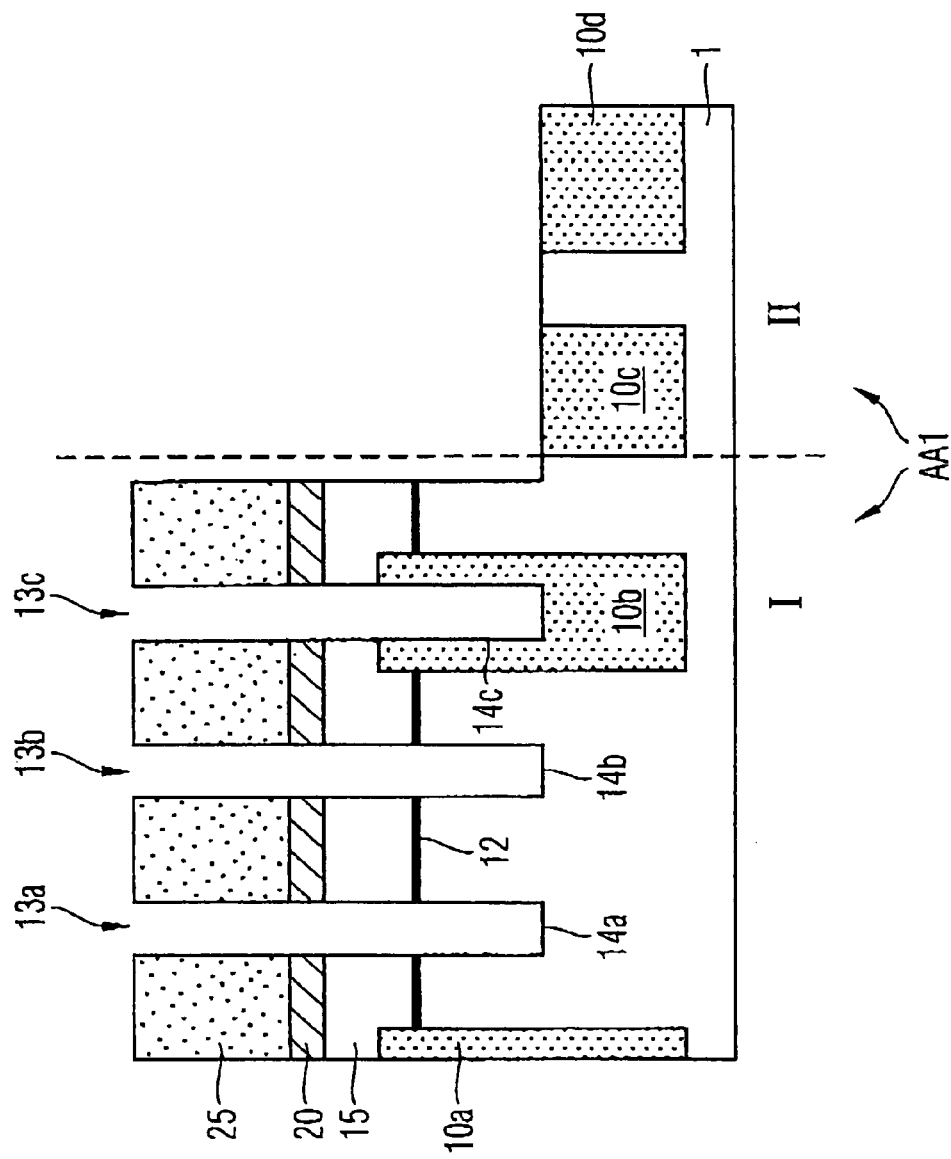

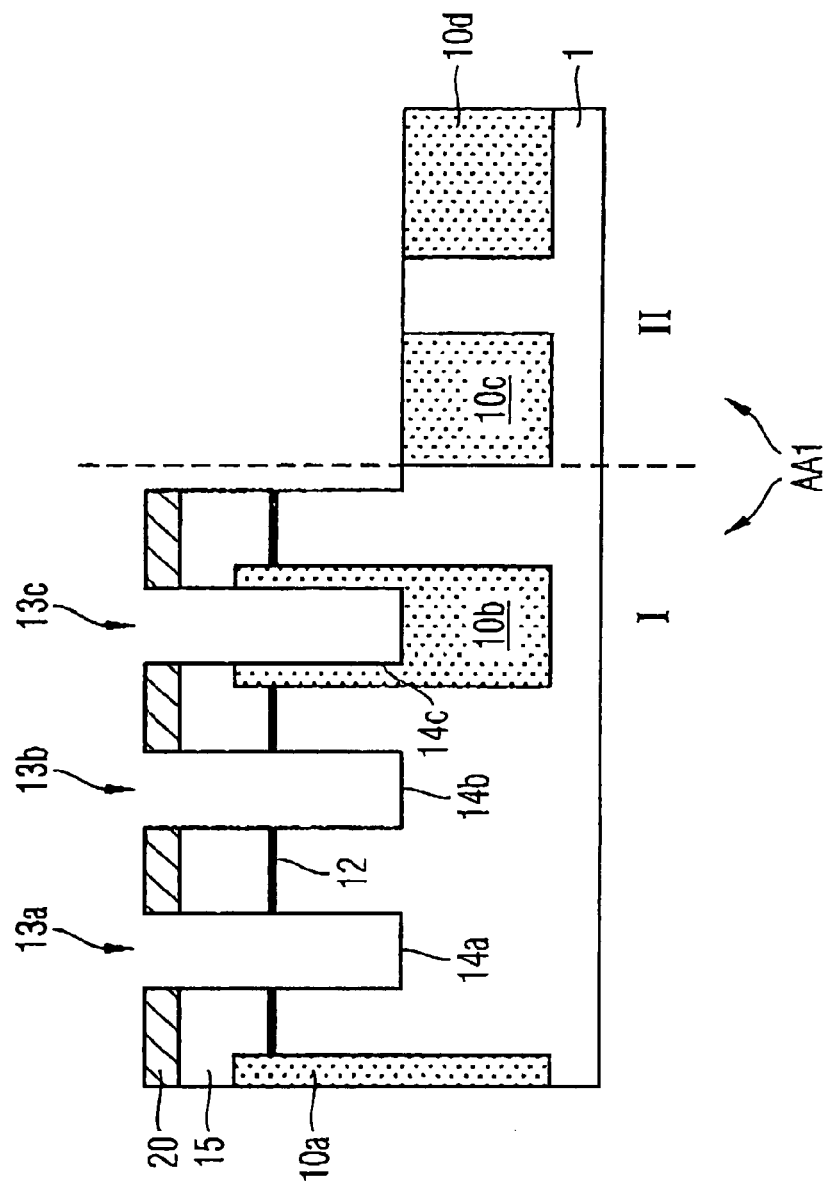

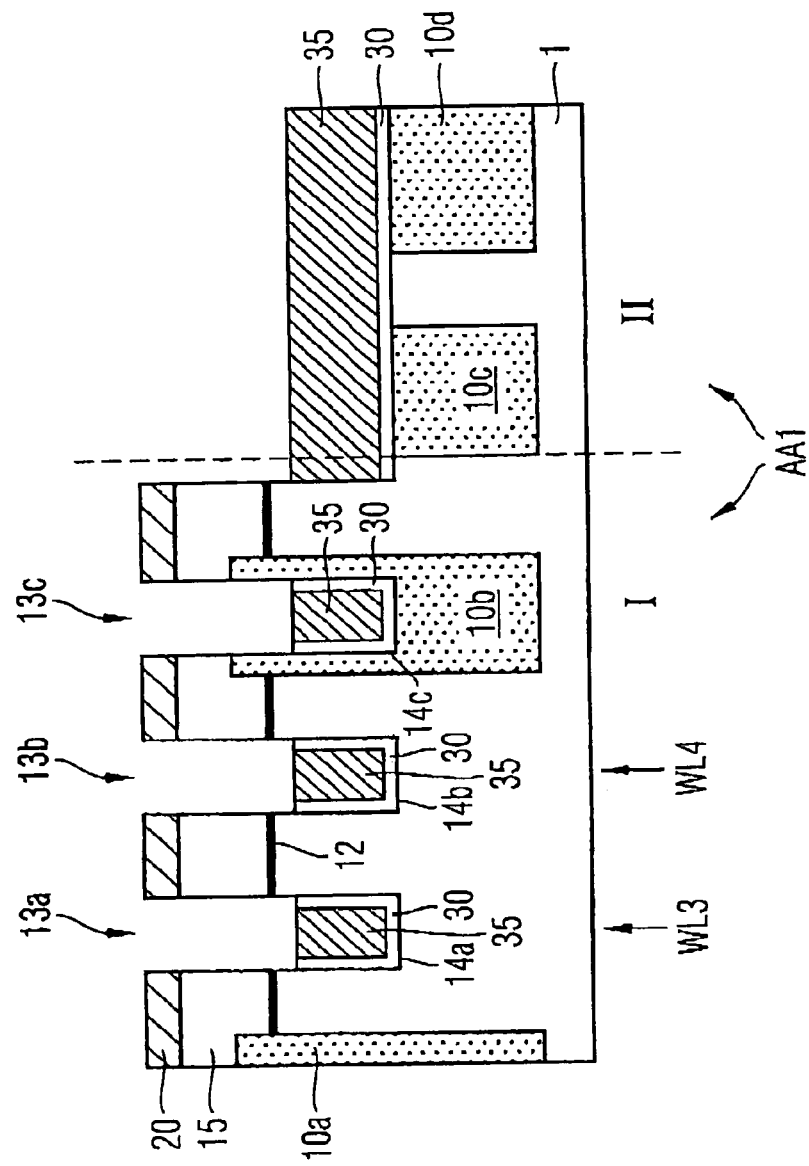

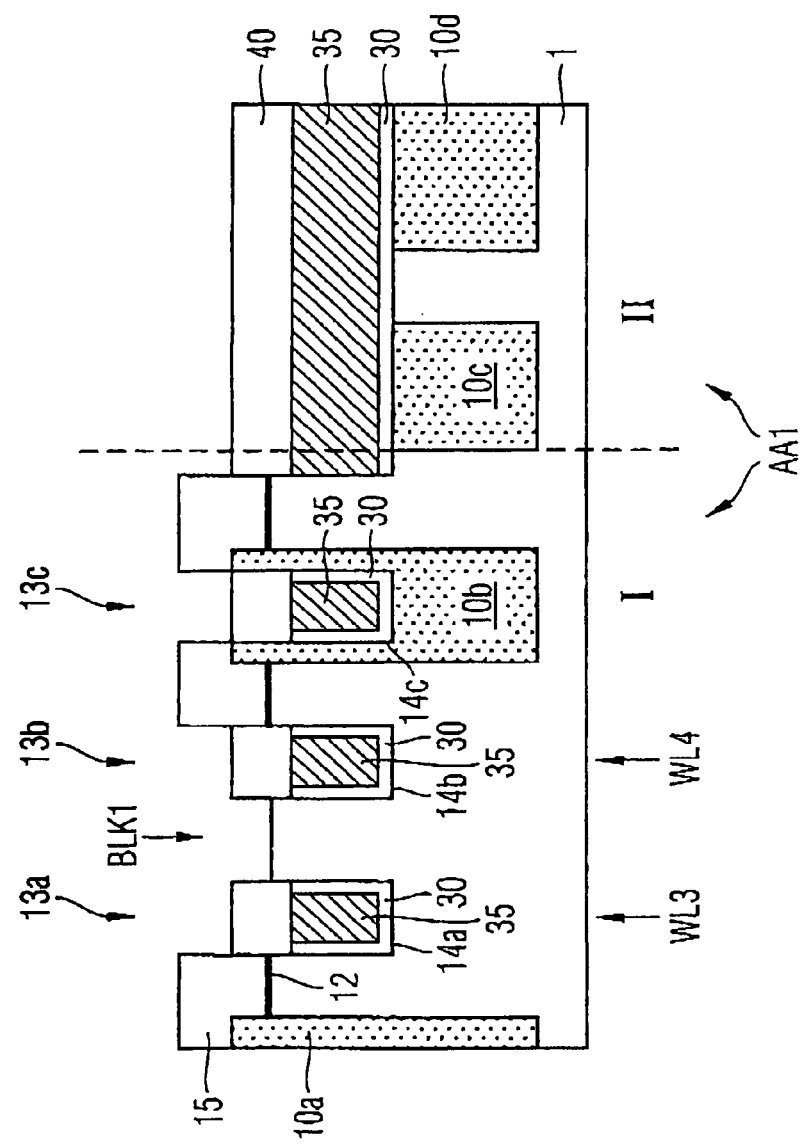

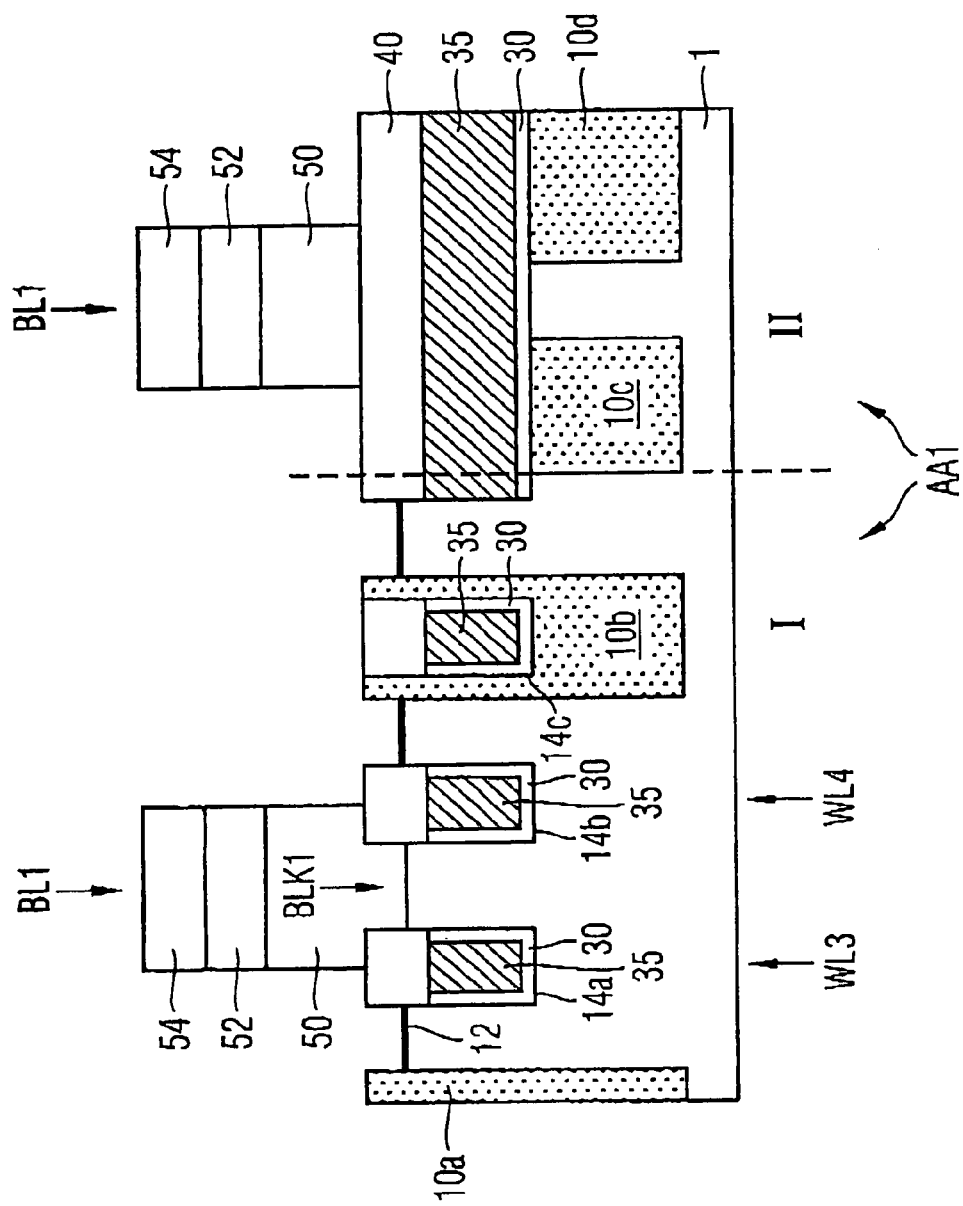

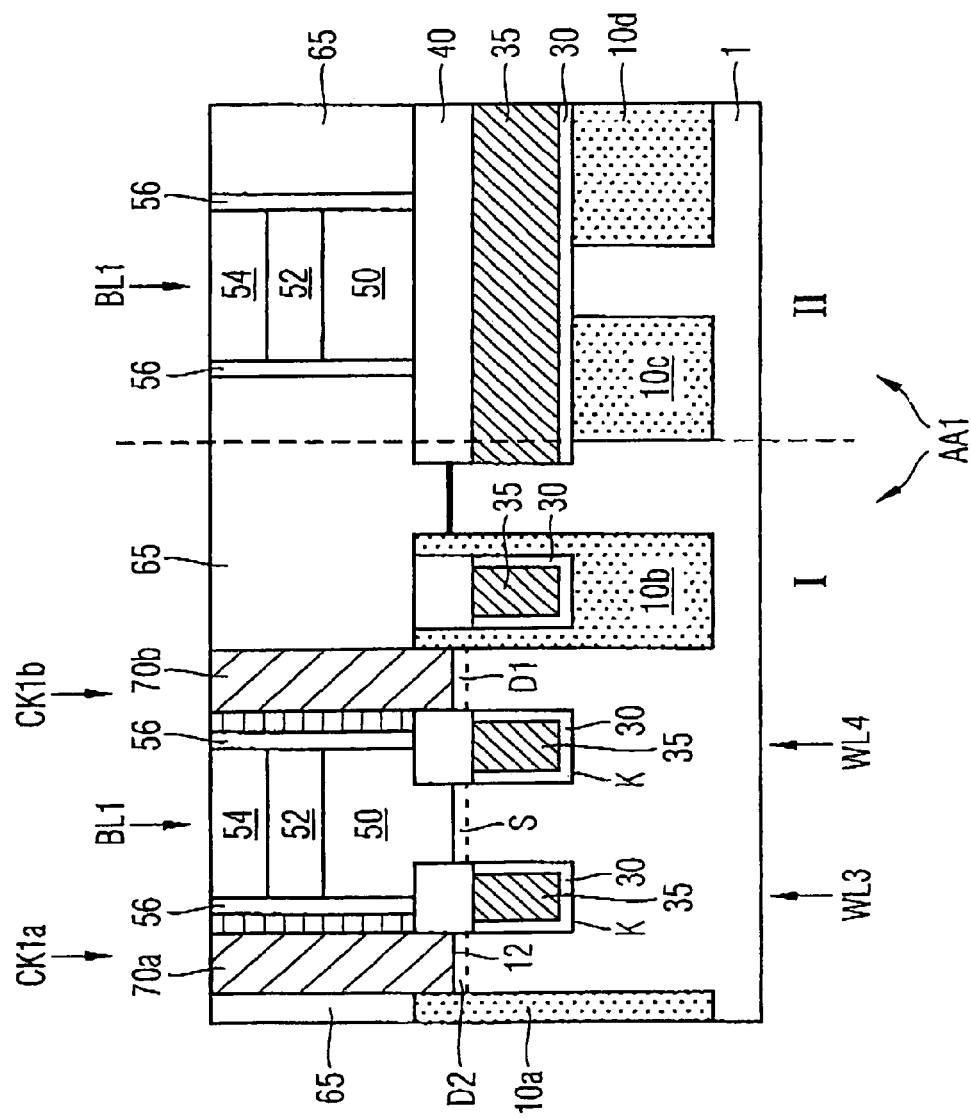

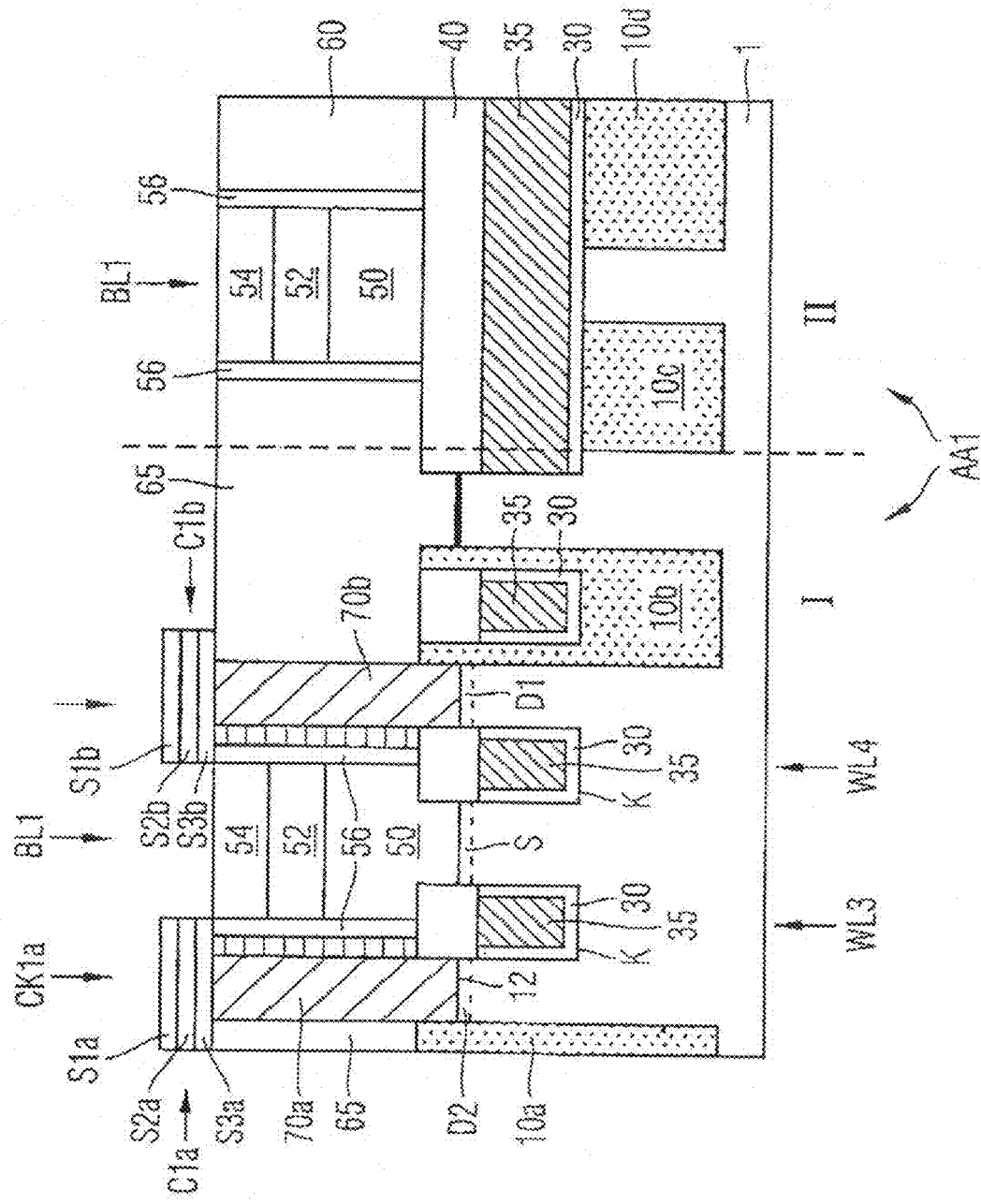

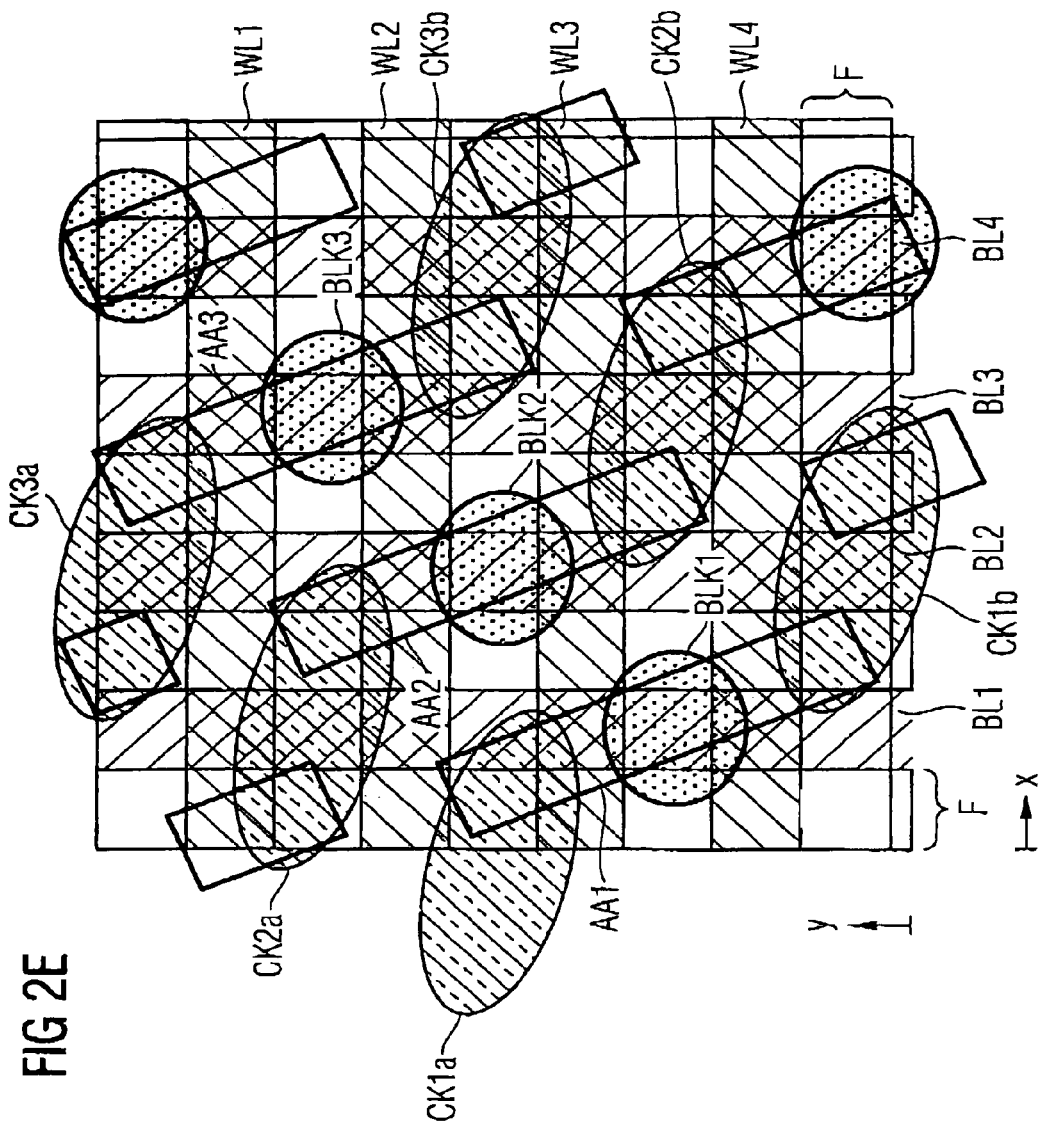

METHOD FOR FABRICATING A MEMORY CELL ARRANGEMENT WITH A FOLDED BIT LINE ARRANGEMENT AND CORRESPONDING MEMORY CELL ARRANGEMENT WITH A FOLDED BIT LINE ARRANGEMENT

BACKGROUND OF THE INVENTION

The present invention relates to a method for fabricating a memory cell arrangement with a folded bit line arrangement, and a corresponding memory cell arrangement with a folded bit line arrangement.

German patent No. 199 28 781 C1 discloses a method for fabricating a memory cell arrangement. This known method involves forming a plurality of active regions in a semiconductor substrate, which are surrounded on all sides by isolation trenches which run perpendicular to one another along a first and second direction. Parallel buried word lines are subsequently formed in each case two adjacent isolation trenches along a first direction, which buried word lines run through a respective active region and are insulated from a channel region in the semiconductor substrate by a gate dielectric layer. A respective source region is formed between the two word lines, and a respective first and second drain region is formed between in each case one of the two word lines and an adjacent isolation trench in each active zone. This is followed by forming a plurality of parallel bit lines along the second direction at the surface of the semiconductor substrate, a bit line in each case running through an associated active region and making contact with the relevant source zone of the associated active region. Finally, a plurality of storage capacitors are formed, in each case a first and a second storage capacitor being connected to an associated drain zone in a respective active region.

Further memory cell arrangements are known, for example, from U.S. Pat. Nos. 6,545,904, 5,502,320, 6,063,669, 6,396,096 B1 and from published European application for patent No. 1 003 219 A2.

Although applicable in principle to any integrated circuits, the present invention and the problem area on which it is based are explained with regard to DRAM memory devices using silicon technology.

Memory cells of a DRAM memory device usually have a storage capacitor for storing electrical charge according to an information state and a selection transistor connected to the storage capacitor. Memory cells of this type are arranged in the surface of a semiconductor substrate and can be driven by means of word and bit lines. The region in the semiconductor substrate in which the selection transistor is formed is generally referred to as the active region. In modern DRAM memory devices, the storage capacitor is usually formed as a trench capacitor or stacked capacitor.

The folded bit line concept is generally understood to mean memory cell arrangements in which every second crossover point between a specific word line and a respective bit line has a memory cell. It is thus possible to route a bit line and an adjacent reference bit line to a sense amplifier and to ensure low-noise operation.

BRIEF SUMMARY OF THE INVENTION

The present invention provides a method for fabricating a memory cell arrangement with a folded bit line arrangement, comprising the steps of: forming a plurality of active regions along a first direction in a semiconductor substrate, which are surrounded by isolation trenches on all sides; forming a plurality of parallel buried word lines along a second direction in the semiconductor substrate, which run through the active regions in each case two buried word lines that are spaced apart from one another and from the isolation trenches running through a respective active region and the buried word lines being insulated from a channel region in the semiconductor substrate by a gate dielectric layer;

forming a respective source region between the two word lines and a first and second drain region between in each case one of the two word lines and an adjacent isolation trench in each active zone;

forming a plurality of parallel bit lines with a folded bit line arrangement along a third direction at the surface of the semiconductor substrate, which runs perpendicular to the second direction, a bit line in each case running through an associated active region and making contact with the relevant source zone of the associated active region;

forming a plurality of storage capacitors, in each case a first and a second storage capacitor being connected to an associated drain zone in a respective active region;

the first direction lying between the second and third directions and the memory cell arrangement having a size of $8F^2$ per memory cell, where F is a unit of length; and an etching step for forming a plurality of word line trenches running through the semiconductor substrate and the isolation trenches according to the word lines to be formed being effected separately from a step for forming the isolation trenches in the semiconductor substrate The present invention also provides a memory cell arrangement with a folded bit line arrangement, comprising:

a plurality of active regions along a first direction in a semiconductor substrate, which are surrounded by isolation trenches on all sides;

a plurality of parallel buried word lines along a second direction in the semiconductor substrate, which run through the active regions in each case two buried word lines that are spaced apart from one another and from the isolation trenches running through a respective active region and the buried word lines being insulated from a channel region in the semiconductor substrate by a gate dielectric layer;

a respective source region between the two word lines and a first and second drain region between in each case one of the two word lines and an adjacent isolation trench in each active zone;

a plurality of parallel bit lines with a folded bit line arrangement along a third direction at the surface of the semiconductor substrate, which runs perpendicular to the second direction, a bit line in each case running through an associated active region and making contact with the relevant source zone of the associated active region;

a plurality of storage capacitors, in each case a first and a second storage capacitor being connected to an associated drain zone in a respective active region;

the first direction lying between the second and third directions and the memory cell arrangement having a size of $8F^2$ per memory cell, where F is a unit of length.

The essential advantage of the present invention is that it provides a memory cell arrangement with a folded bit line arrangement, and a corresponding fabrication method, which has a small space requirement of minimally only $8F^2$ and can be fabricated relatively simply and reliably.

The completely buried word lines with u-shaped transistors provide for small electric fields and low word/bit line capacitances. This creates high-performance memory cells having a favorable retention time distribution which, moreover, are readily scaleable to ever shrinking ground rules.

The plurality of parallel buried word lines may be formed by the following steps of: providing a mask on the top side of the semiconductor substrate; carrying out a first anisotropic etch for forming a plurality of word line trenches according to the word lines to be formed; forming the gate dielectric layer in the word line trenches; forming a metallic filling above the gate dielectric layer in the word line trenches; etching back the metallic filling to below the top side of the semiconductor substrate; and closing off the word line trenches with an insulation layer.

In one embodiment of the inventive method, a second isotropic etch is carried out for widening the word line trenches in the first direction and for rounding the bottoms of the word line trenches.

In a further embodiment of the inventive method, the following steps are carried out: forming an insulation layer between the bit lines; and forming a plurality of capacitor contacts in the insulation layer, in each case two capacitor contacts being formed in a respective active region, which contacts make contact with the first and second drain zones; the first and second storage capacitors in each case being connected to the associated drain zone via an associated capacitor contact in a respective active region.

The plurality of bit lines may be formed by the following steps of: forming a polysilicon layer in electrical contact with the source region, an overlying metal layer and an overlying silicon nitride layer on the top side of the semiconductor substrate; patterning the layers to form the bit lines; and forming silicon nitride sidewall spacers on the sidewalls of the bit lines.

Gates for peripheral elements of the memory cell arrangement may simultaneously be formed from the layers of the bit lines.

An exemplary embodiment of the invention is illustrated in the drawings and is explained in more detail in the description below.

BRIEF DESCRIPTION OF THE SEVERAL VIEWS OF THE DRAWINGS

FIGS. 1A-K are schematic illustrations of successive method stages of a method for fabricating a memory cell arrangement in accordance with one embodiment of the present invention.

FIGS. 2A-F are schematic illustrations of the memory cell arrangement in successive method stages in accordance with the embodiment of the present invention.

DETAILED DESCRIPTION OF THE INVENTION

In the figures, identical reference symbols designate identical or functionally identical component parts.

Figure 1G:
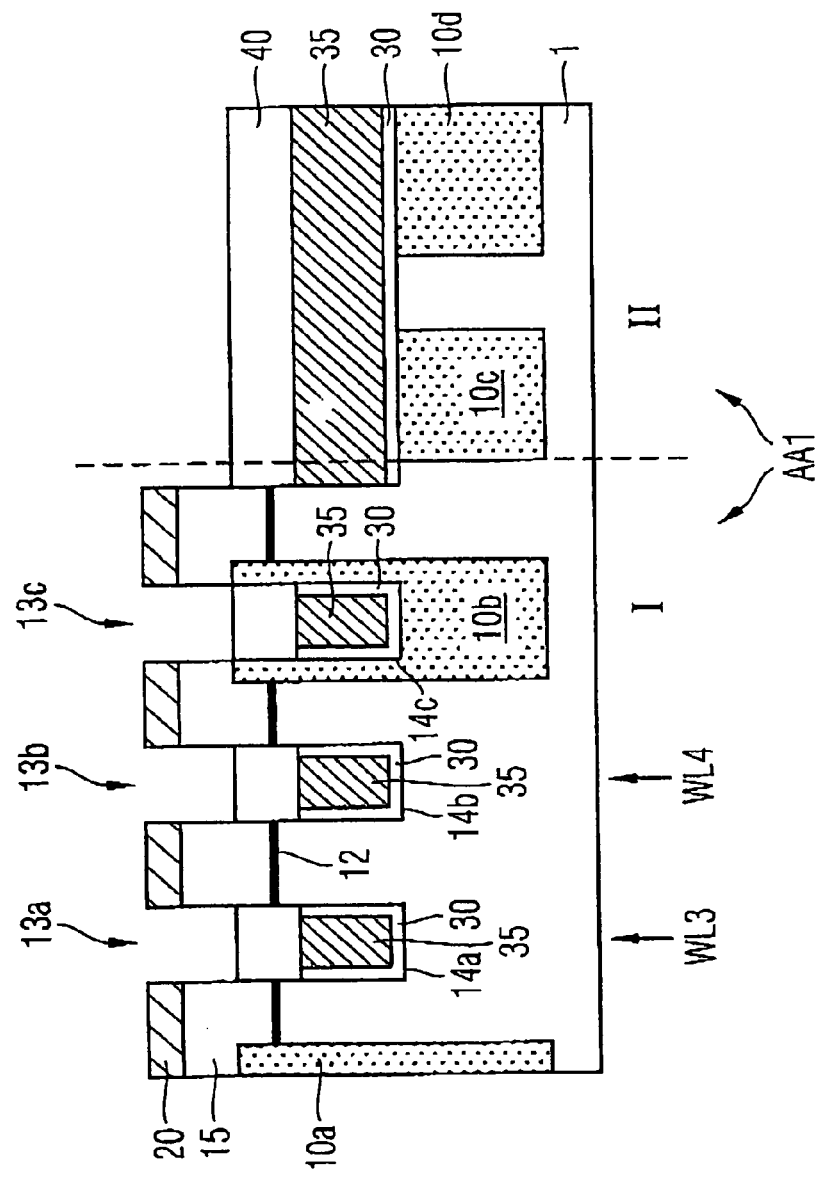
Figure 2A:
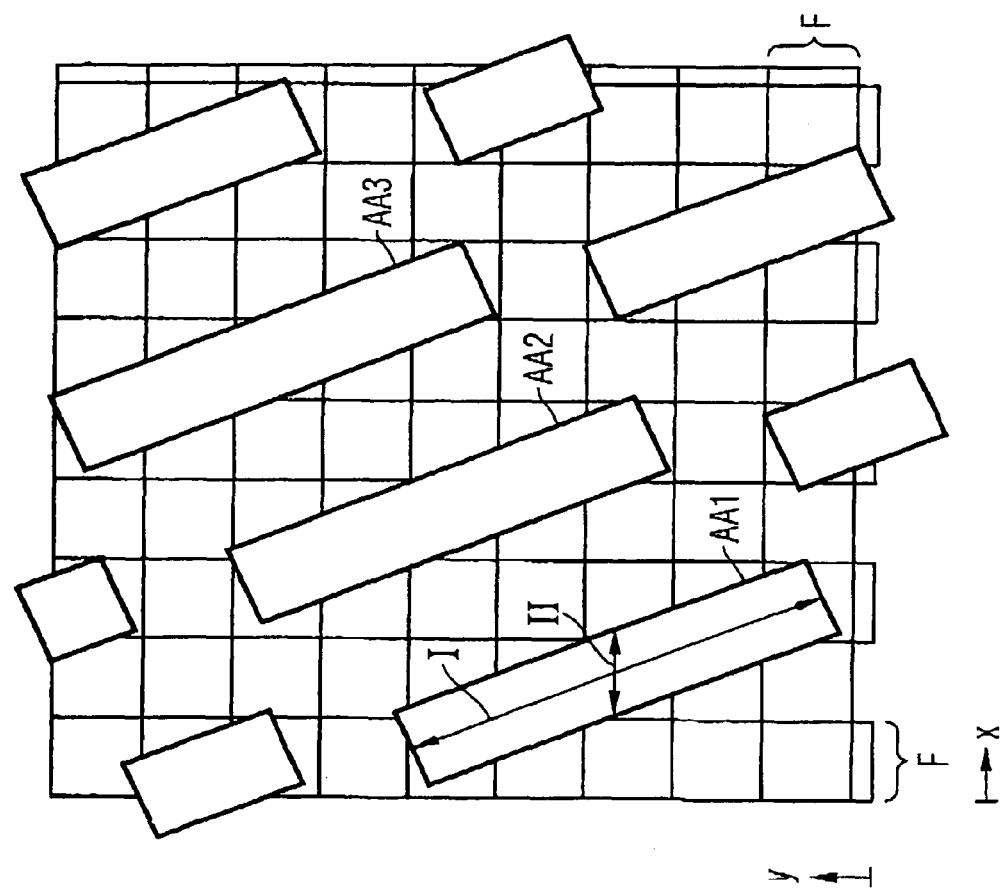

FIG. 1A shows a section through an active zone AA1 of a memory cell arrangement in accordance with the embodiment of the present invention, the left-hand side I showing a longitudinal section and the right-hand side 11 showing a cross section (cf. FIG. 2A).

Reference symbol 1 in FIG. 1A designates a silicon semiconductor substrate, on the top side of which are situated a pad oxide layer (not illustrated) and an overlying hard mask layer 5 made of silicon nitride. Reference symbols 10a, 10b, 10c, 10d designate STI isolation trenches (STI=Shallow Trench Isolation), which are filled with silicon oxide and surround the active zone AA1 on all sides.

Referring further to FIG. 1B, the STI trenches 10a-10d are pulled back to just above the surface of the semiconductor substrate 1, so that they form a small overhang ST. Afterwards, the hard mask 5 made of silicon nitride is removed and the underlying pad oxide layer (not shown) is likewise removed. Implantations may subsequently be carried out in the active zone A in order to provide source/drain regions, which are shown only starting from FIG. 1J for reasons of clarity. Prior to these implantations, a screen oxide may be applied on the surface of the silicon semiconductor substrate 1, and is removed again after the implantations.

A gate oxide layer 12 (for the periphery/support) is subsequently formed on the top side of the silicon semiconductor substrate 1, after which a layer 15 made of undoped polysilicon and a layer 20 made of silicon nitride may be deposited over the whole area. This leads to the process state shown in FIG. 1B.

As illustrated in FIG. 1C, a carbon hard mask 25 is thereupon provided on the silicon nitride layer 20, said mask having openings 13a, 13b, 13c. An etch is then carried out by means of the carbon hard mask 25 in order to remove the silicon nitride layer 20 and the polysilicon layer 50 in the region of the openings 13a-13c. Said etch stops on the gate oxide layer 12, as illustrated in FIG. 1C.

In a subsequent etching step, as shown in FIG. 1 D, the gate oxide layer 12 is then perforated by a further etching step and word line trenches 14a-14c are formed in the silicon semiconductor substrate 1 and in the STI trench 10b, respectively. Said etching step is not selective since it etches both silicon and silicon oxide.

Referring further to FIG. 1D, the carbon hard mask 25 is removed, after which a respective isotropic etch of silicon and silicon oxide is carried out in order to expand the word line trenches 14a-14c in the lateral direction. A silicon nitride etching step is subsequently carried out in order to laterally expand in the same way the silicon nitride layer 20 serving as an etching mask during the preceding etching step. During the isotropic etch in accordance with FIG. 1E, an edge rounding (not illustrated) likewise occurs in the lower region of the word line trenches 14A-14C, which brings about a field diminution for degradation of the transistor regions situated there.

As illustrated in FIG. 1F, a gate oxidation then takes place in order to form a gate oxide layer 30 in the word line trenches 14a, 14b, 14c. A metal filling 35 made of titanium nitride and tungsten is subsequently provided in the word line trenches 14A above the gate oxide layer 30, after which both the gate oxide layer 30 and the metal filling 35 are pulled back to below the top side of the semiconductor substrate 1. The metal filling 35 forms the word lines WL3, WL4 in the word line trenches 14a-14c of the memory cell arrangement in accordance with this embodiment (cf. FIG. 2B).

As illustrated in FIG. 1G, an HDP oxide layer 40 is then provided above the metal filling 35 in the word line trenches 14a-14c. This may be carried out by means of a deposition process, followed by a CMP step and a recess etching step.

As illustrated in FIG. 1H, this is followed by a lithography step, by means of a photomask (not illustrated), for removing the silicon nitride layer 20, the underlying polysilicon layer 15 and the underlying gate oxide layer 12 in the region of a bit line contact BLK1 to the semiconductor silicon substrate 1. The photoresist mask (not shown) is subsequently removed again.

As illustrated in FIG. 1I, a gate stack having lower polysilicon layer 50, a middle tungsten layer 52 and an upper silicon nitride layer 54 is then deposited and patterned in the bit line contact region BLK1.

The gate stacks 50, 52, 54 serve as gates in peripheral transistors, but as a bit line in the memory cells in the memory cell arrangement in accordance with the present embodiment.

Figure 2B:
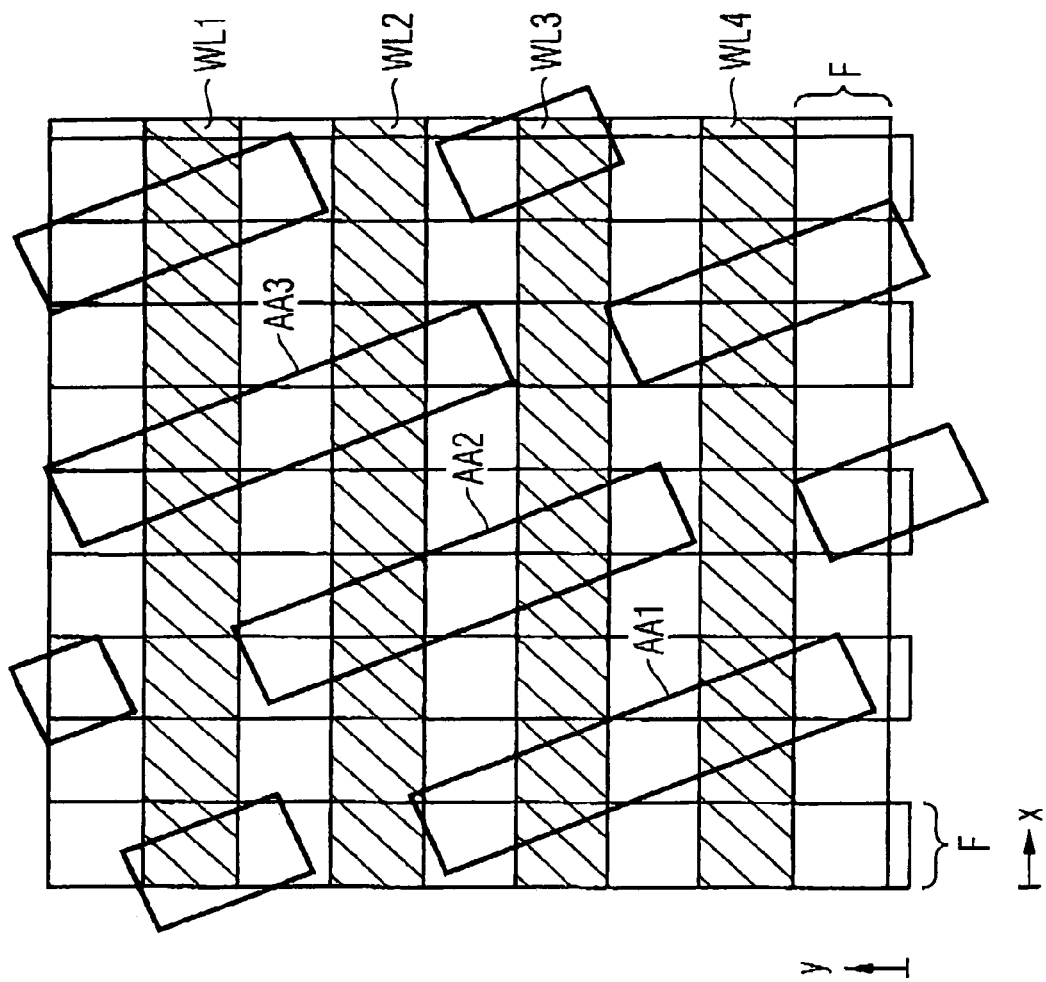
Figure 2C:
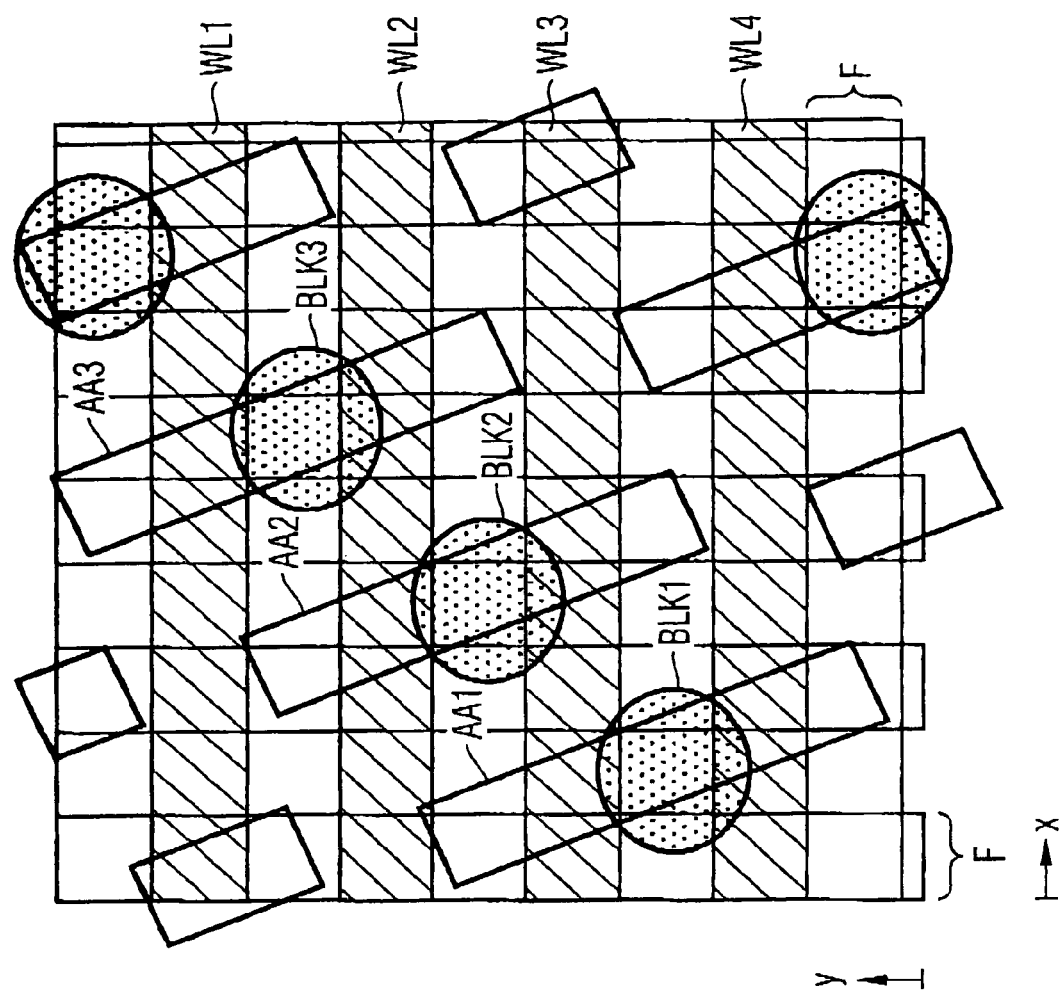
Figure 2D:
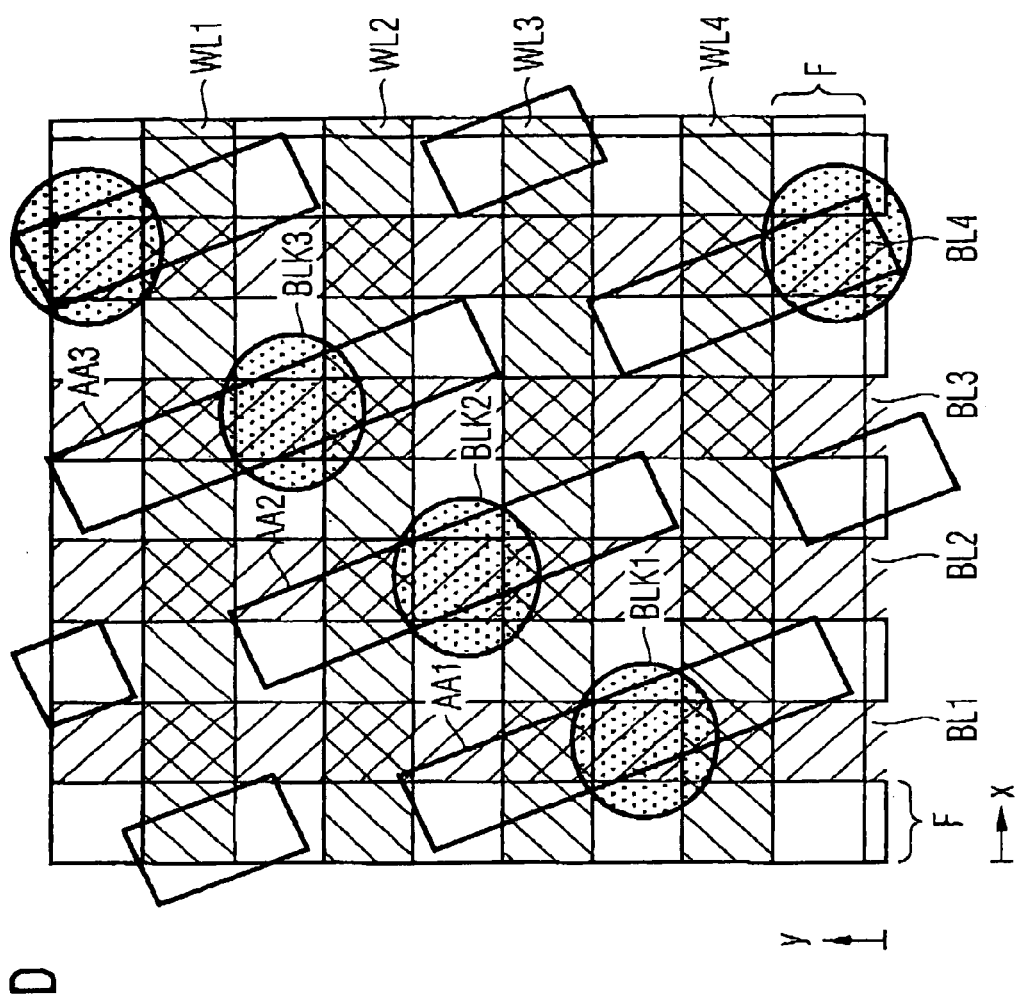

The gate stack illustrated in FIG. 11 corresponds to the bit line BL1 in accordance with FIG. 2D.

Referring further to FIG. 1J, sidewall spacers 56 made of silicon nitride are provided on the sidewalls of the gate stacks 50, 52 and 54. Afterwards, a silicon oxide layer 65 is deposited over the resulting structure and planarized as far as the top side of the silicon nitride layer 54 of the gate stacks 50, 52, 54. A subsequent process step then involves forming contacts 70A, 70B to the semiconductor substrate 1 in the drain regions D1, D2 of the memory cells linked via a common source region S in this active region AA (cf. FIG. 2F). Although the drain regions D1, D2 and the common source region S have only been depicted for the first time in FIG. 1J for reasons of clarity, they were formed as early as in the process stage between FIGS. 1A and 1B, as already mentioned above. K designates a channel region along the buried word lines WL3, WL4.

Figure 2F:
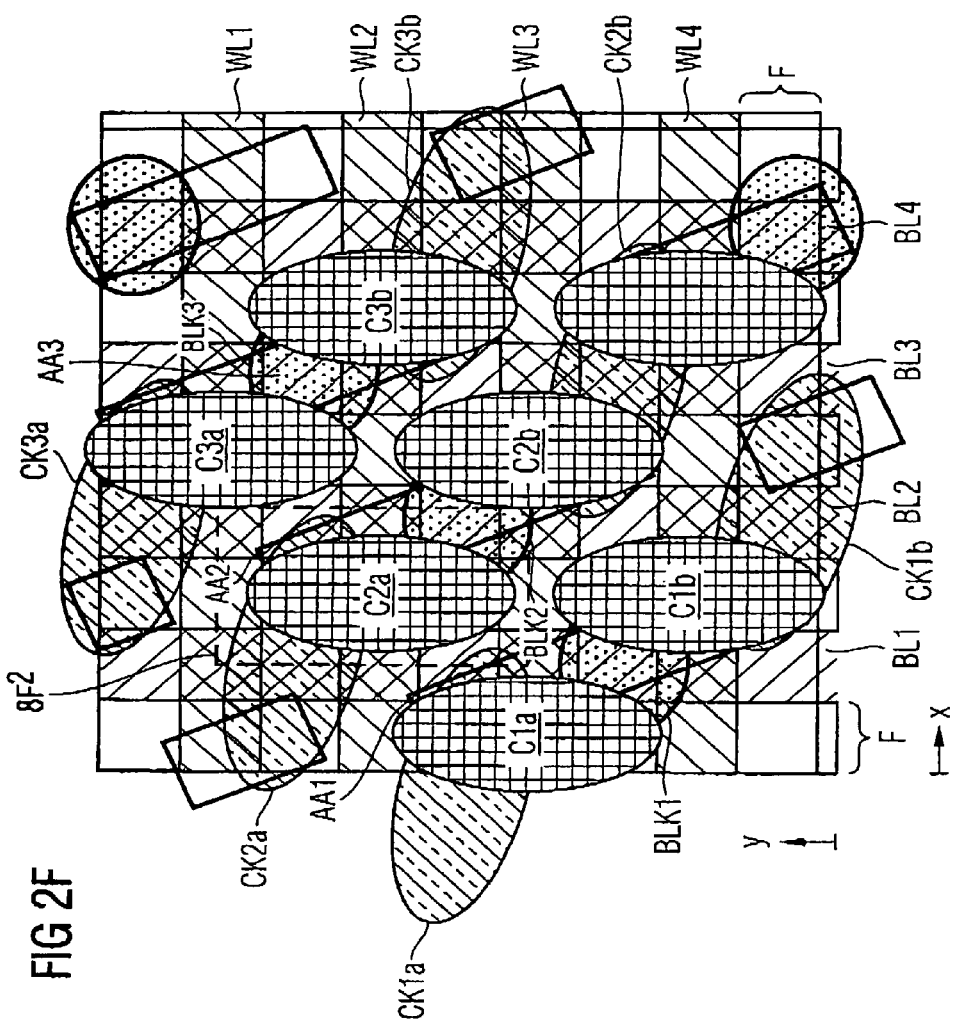

Finally, referring to FIG. 1K, above the contacts 70a, 70b, schematically indicated capacitor structures S1a, S2a, S3a and S1b, S2b, S3b, respectively, are formed, comprising two conductive layers and an intervening insulation layer, which form storage capacitors C1a and C1b, respectively, for the corresponding memory cells (cf. FIG. 2F).

FIGS. 2A-F show schematic illustrations of the memory cell arrangement in successive method stages in accordance with the embodiment of the present invention. FIGS. 2A-F therefore progressively illustrate the construction of the memory cell arrangement in accordance with the present embodiment.

FIG. 2A shows a grid having a minimum structure width F as a unit of length in the x and y directions.

AA1, AA2, AA3 designate active zones, of which the construction of the active zone AA1 has been explained above, by way of example, with reference to FIGS. 1A-1K, to be precise along the sections I (longitudinal section) and II (cross section) shown.

FIG. 2B illustrates the course of the word lines WL1-WL4 in the x direction, the word lines WL3 and WL4 running in the word line trenches 14A, 14B illustrated in FIG. 1F.

Referring further to FIG. 2C, the bit line contacts BLK1, BLK2, BLK3 are shown, of which the bit line contact BLK1 has already been explained in connection with FIG. 1H.

FIG. 2D elucidates the arrangement of the word lines WL1, WL2, WL3, WL4, of which the word line WL1 has already been explained in connection with FIG. 1I. The folded bit line concept is already evident in FIG. 2D, every second crossover point between a specific word line and a respective bit line having a memory cell.

In connection with FIG. 2E, the capacitor contacts CK1a, CK1b, CK2a, CK2b, CK3a, CK3b are illustrated, of which the capacitor contacts CK1a, CK1b have already been explained in connection with FIG. 1J.

Finally, FIG. 2F illustrates the arrangement of the capacitors C1a, C1b, C2a, C2b, C3a, C3b of which the capacitors C1a, C1b have already been explained in connection with FIG. 1K.

It should be noted in this connection that the capacitor contacts are separated by a chemical mechanical polishing step in the region of the bit lines, thereby ensuring that a capacitor is in each case only connected to one memory cell.

If consideration is given to the layout illustration in accordance with FIG. 2F, it is evident that the corresponding memory cells have a space requirement of $8F^2$, since a cell having an area of 2F 2F is connected to each bit line but only to every second word line, which results in an area requirement of $4F^2+4F^2=8F^2$.

Although the present invention has been described above on the basis of a preferred exemplary embodiment, it is not restricted thereto, but rather can be modified in diverse ways.

In particular the arrangement and the construction of the capacitors are only by way of example and can be varied diversely.

What is claimed is:

1. An integrated circuit having a memory cell arrangement with a folded bit line arrangement, comprising:
    a plurality of active regions along a first direction in a semiconductor body; the active regions being surrounded by isolation trenches on all sides;
    a plurality of parallel buried word lines along a second direction in the semiconductor body; the buried word lines running through the active regions and having an upper portion below a surface of the semiconductor body, where two of the buried word lines are spaced apart from one another and from the isolation trenches running through a respective active region, and the buried word lines being insulated from a channel region in the respective active region by a gate dielectric layer;
    a source region between the two buried word lines;
    a first drain region between one of the two buried word lines and an isolation trench portion;
    a second drain region between the other of the two buried word lines and another isolation trench portion;
    a plurality of parallel bit lines along a third direction at the surface of the semiconductor body; the bit lines running perpendicular to the second direction;
    wherein a bit line makes contact with the source region;
    a plurality of storage capacitors; a first and second storage capacitor of the plurality of storage capacitors being connected to the first and second drain regions, respectively;
    wherein the first direction is diagonal to the second and third directions.

2. The integrated circuit of claim 1, further comprising an insulation layer formed between the bit lines; and
    a plurality of capacitor contacts formed in the insulation layer; wherein first and second capacitor contacts make contact with the first and second drain regions, respectively; and wherein the first and second storage capacitors are connected to the respective first and second drain regions via the respective first and second capacitor contacts.

3. The integrated circuit of claim 1, wherein the plurality of bit lines are formed from a polysilicon layer in electrical contact with the source region, an overlying metal layer, and an overlying silicon nitride layer on a top side of the semiconductor body, and wherein silicon nitride sidewall spacers are formed on sidewalls of the bit lines.

4. The integrated circuit of claim 3, further comprising gates for peripheral elements of the memory cell arrangement formed from the layers of the bit lines.

5. The integrated circuit of claim 1, further comprising word line trenches running through the semiconductor body, wherein each word line trench comprises at least one buried word line.

6. The integrated circuit of claim 5, wherein the buried word lines comprise a metallic filling arranged above a gate dielectric layer in the word line trench.

7. The integrated circuit of claim 6, further comprising a respective insulative layer on top of the metallic filling for closing off each respective word line trench.

8. An integrated circuit formed on a substrate, the integrated circuit comprising:

a plurality of active regions formed in the substrate as line segments oriented in a first direction; the active regions being surrounded by isolation trenches on all sides;

a plurality of buried word lines running in parallel along a second direction, wherein each active region is intersected by two buried word lines, thereby defining a source region and two drain regions at an upper end of the respective active region, the source region being located between the two buried wordlines, and the two drain regions being located at the respective sides of the two buried wordlines being opposite relative to the source region;

a plurality of bit lines running in a third direction perpendicular to the second direction and being connected to corresponding source regions;

a plurality of storage capacitors; each storage capacitor being connected to a corresponding drain region;

wherein the first direction is diagonal to the second and third directions.

9. An integrated circuit formed on a substrate, the integrated circuit comprising:

a plurality of active regions formed in the substrate as line segments oriented in a first direction;

a plurality of buried word lines having an upper portion below a surface of the semiconductor body, the buried word lines running in parallel along a second direction, wherein an active region is intersected by two buried word lines, thereby defining a source region and two drain regions at an upper end of the respective active region, the source region being located between the two buried word lines, and the two drain regions being located at the respective sides of the two buried word lines being opposite relative to the source region;

a plurality of bit lines running in a third direction perpendicular to the second direction and being connected to corresponding source regions;

a plurality of storage capacitors; each storage capacitor being connected to a corresponding drain region;

wherein the first direction is diagonal to the second and third directions.

* * * * *